United States Patent
Ishida

(10) Patent No.: US 9,889,476 B2
(45) Date of Patent: Feb. 13, 2018

(54) SUBSTRATE PROCESSING APPARATUS AND SUBSTRATE PROCESSING METHOD

(71) Applicant: Tokyo Electron Limited, Tokyo (JP)

(72) Inventor: Seiki Ishida, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/003,321

(22) Filed: Jan. 21, 2016

(65) Prior Publication Data

US 2016/0225644 A1 Aug. 4, 2016

(30) Foreign Application Priority Data

Jan. 30, 2015 (JP) .................................. 2015-017295

(51) Int. Cl.
| | |
|---|---|
| H01L 21/02 | (2006.01) |
| B08B 3/10 | (2006.01) |
| H01L 21/67 | (2006.01) |
| H01L 21/687 | (2006.01) |

(52) U.S. Cl.
CPC .......... B08B 3/10 (2013.01); H01L 21/02041 (2013.01); H01L 21/67051 (2013.01); H01L 21/68728 (2013.01); H01L 21/68742 (2013.01)

(58) Field of Classification Search
None
See application file for complete search history.

(56) References Cited

U.S. PATENT DOCUMENTS

2008/0189975 A1* 8/2008 Miya ................. H01L 21/68728
34/317
2015/0336127 A1* 11/2015 Emory ..................... B05C 5/02
118/52

FOREIGN PATENT DOCUMENTS

JP 2002-270563 A 9/2002

* cited by examiner

*Primary Examiner* — Michael Barr
*Assistant Examiner* — Jason Riggleman
(74) *Attorney, Agent, or Firm* — Abelman, Frayne & Schwab

(57) ABSTRACT

A first holding plate and a second holding plate are provided. The first holding plate has a first flat plate portion facing a bottom surface of a substrate and holds the substrate so as to form a gap between the first flat plate portion and the substrate as a first gap, and the second holding plate has a second flat plate portion facing the bottom surface of the substrate and holds the substrate so as to form a gap between the second flat plate portion and the substrate as a second gap. Depending on a processing to be performed, any one of the first holding plate and the second holding plate is mounted on a rotational shaft of a shaft mechanism that includes a fluid supply unit configured to supply a fluid to the bottom surface of the substrate and the rotational shaft configured to rotate the substrate. The processing is performed on the substrate by supplying the fluid to the bottom surface of the substrate from the fluid supply unit.

10 Claims, 10 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2015-017295, filed on Jan. 30, 2015, with the Japan Patent Office, the disclosure of which is incorporated herein in its entirety by reference.

TECHNICAL FIELD

The present disclosure relates to a substrate processing apparatus and a substrate processing method that perform a processing on a substrate while supplying a fluid to a bottom surface of the substrate.

BACKGROUND

A process for manufacturing a semiconductor device includes performing a liquid processing by supplying a processing liquid to an upwardly facing front surface of a substrate, such as a semiconductor wafer, while rotating the substrate around a perpendicular axis in a horizontal position. In some cases, simultaneously with performing the liquid processing on the front surface of the substrate that faces upward, the liquid processing is also performed on the rear surface of the substrate that faces downward by supplying the processing liquid to the rear surface of the substrate. Further, in some cases, when the liquid processing is performed on the front surface of the substrate, a gas such as, for example, nitrogen gas, may be supplied to the rear surface of the substrate in order to suppress the processing liquid supplied to the front surface of the substrate from flowing to the rear surface side, to suppress contaminants from being attached to the rear surface of the substrate, or to reduce an oxygen concentration in a space formed at the rear surface side of the substrate.

When the gas is supplied to the rear surface of the substrate, it is desired that the space formed below the substrate is narrow in order to achieve the above-described purposes with a small flow rate of the gas. Meanwhile, it is not desired that the area of the space below the substrate when the processing liquid is supplied to the rear surface of the substrate is the same as that when the gas is supplied to the rear surface of the substrate. In this case, it is desired that the space formed below the substrate is relatively wide such that the processing liquid supplied to the central portion of the rear surface of the substrate smoothly flows to the peripheral edge of the substrate via the rear surface of the substrate.

For a user of a substrate processing system, it is desired that a single substrate processing unit is commonly available for a plurality of kinds of processings from the viewpoints of both apparatus costs and foot print reduction.

The above-described demand may be partially responded by providing a disc-shaped member, which is liftable and rotates together with a substrate holding member, below a substrate so as to adjust a gap between the substrate and the disc-shaped member as disclosed in Japanese Laid-Open Patent Publication No. 2002-270563. However, when a lift driving mechanism configured to lift the disc-shaped member is mounted in the substrate holding member that is a rotational body, the structure of the substrate processing unit becomes complicated, and particle generation sources are increased. The particle generation sources also easily cause the weight increase and rotational unbalance of rotation bodies and rotational unbalance.

SUMMARY

According to the present disclosure, there is provided a substrate processing apparatus including a fluid supply unit configured to supply a fluid to a bottom surface of a substrate; a rotational shaft configured to rotate the substrate; and a connection portion provided on the rotational shaft to selectively connect therewith a first holding plate and a second holding plate. The first holding plate includes a first flat plate portion facing the bottom surface of the substrate, the first holding plate being configured to hold the substrate to form a vertical gap between a top surface of the first flat plate portion and the bottom surface of the substrate as a first gap, and the second holding plate includes a second flat plate portion facing the bottom surface of the substrate, the second holding plate being configured to hold the substrate to form a vertical gap between a top surface of the second flat plate portion and the bottom surface of the substrate as a second gap that is larger than the first gap.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
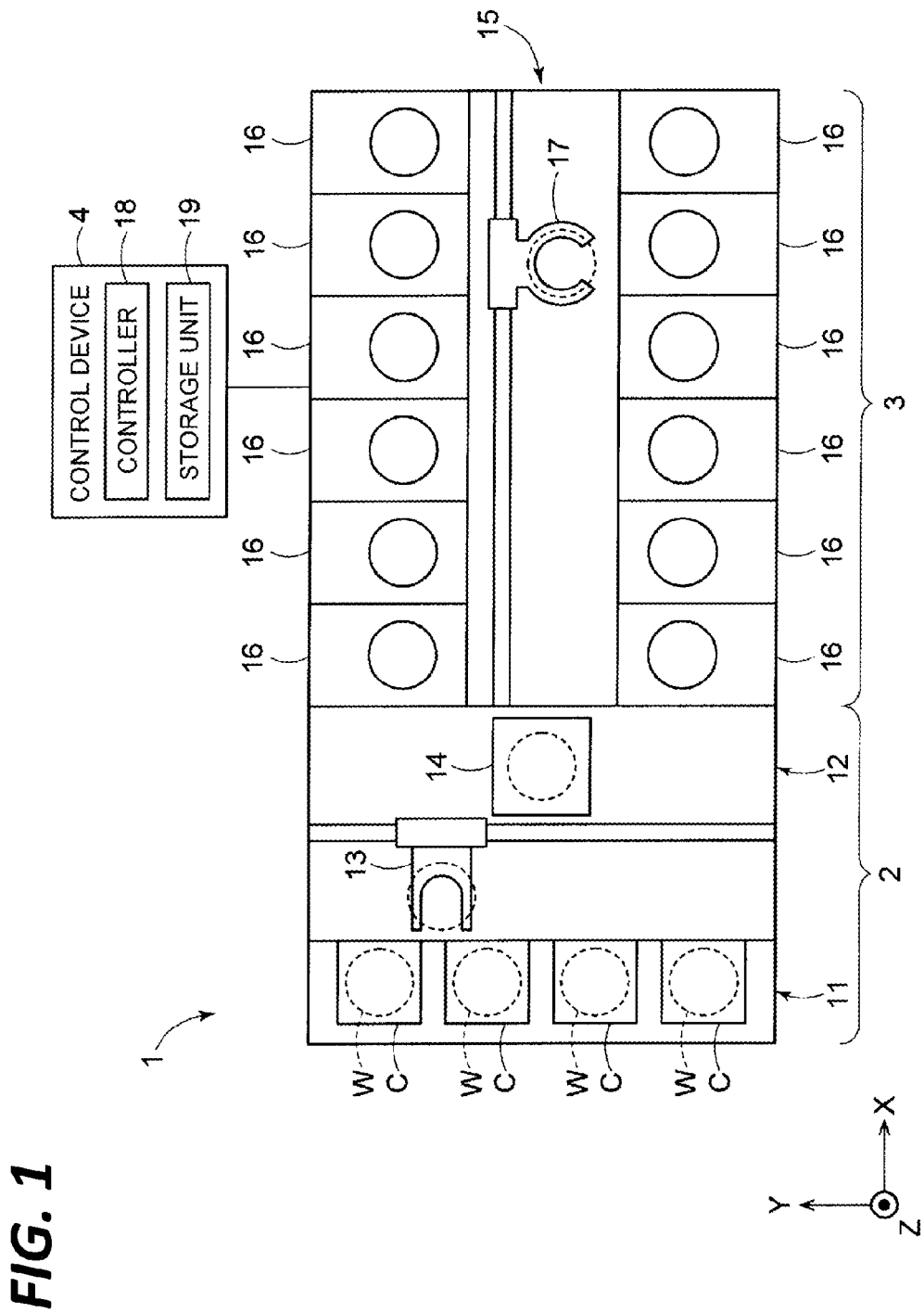
FIG. 1 is a plan view illustrating an outline of a configuration of a substrate processing system according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure is to provide a technology that is able to commonly use a single processing unit for a plurality of kinds of processings without complicating the structure of the processing unit.

According to an exemplary embodiment of the present disclosure, there is provided a substrate processing apparatus including a fluid supply unit configured to supply a fluid to a bottom surface of a substrate; a rotational shaft configured to rotate the substrate; and a connection portion provided on the rotational shaft to selectively connect therewith a first holding plate and a second holding plate. The first holding plate includes a first flat plate portion facing the bottom surface of the substrate, the first holding plate being configured to hold the substrate to form a vertical gap between a top surface of the first flat plate portion and the bottom surface of the substrate as a first gap, and the second holding plate includes a second flat plate portion facing the bottom surface of the substrate, the second holding plate being configured to hold the substrate to form a vertical gap between a top surface of the second flat plate portion and the bottom surface of the substrate as a second gap that is larger than the first gap.

In the above-described substrate processing apparatus, the fluid supply unit is configured to supply a liquid and a gas to the bottom surface of the substrate, in which the first holding plate is mounted when the gas is supplied from the fluid supply unit, and the second holding plate is mounted when the liquid is supplied from the fluid supply unit.

In the above-described substrate processing apparatus, a top surface of the rotational shaft has a central area and a peripheral area that is formed around the central area and has a height lower than that of the central area, and the connection portion is provided in the peripheral area. The first holding plate has a first attachment portion to be attached to the connection portion, and the second holding plate has a second attachment portion to be attached to the connection portion. A difference between the first gap and the second gap corresponds to a difference between a height of the first attachment portion and a height of the second attachment portion.

In the above-described substrate processing apparatus, the top surface of the rotational shaft has a central area and a peripheral area that is formed around the central area and has a height lower than the central area, and the connection portion is provided in the peripheral area. The second holding plate has a second attachment portion to be attached to the connection portion, and a top surface of the second holding plate and the central area have an equal height when the second attachment portion is attached to the connection portion.

In the above-described substrate processing apparatus, the top surface of the rotational shaft has a central area and a peripheral area that is formed around the central area and has a height lower than that of the central area. The connection portion is provided in the peripheral area and the first holding plate has a first attachment portion to be attached to the connection portion. The first holding plate has an inclined surface that is formed to guide a gas supplied from the fluid supply unit toward an upper side of the first flat plate portion from the central area when the first attachment portion is attached to the connection portion.

The above-described substrate processing apparatus further includes a processing liquid supply pipe configured to supply a liquid from the fluid supply unit, a gas supply passage configured to supply a gas from the fluid supply unit, and an enlarged diameter portion that covers the gas supply passage at an upper side thereof around a top end of the processing liquid supply pipe. The inclined surface guides the gas passing between the enlarged diameter portion and the central area toward the upper side of the first flat plate portion.

In the above-described substrate processing apparatus, at least one first holding plate and at least one second holding plate are provided.

The above-described substrate processing apparatus further includes an accommodation section configured to accommodate at least one of the first holding plate and the second holding plate.

According to another exemplary embodiment of the present disclosure, there is provided a substrate processing method including: providing a first holding plate that has a first flat plate portion facing a bottom surface of a substrate, the first holding plate being configured to hold the substrate to form a gap between a top surface of the first flat plate portion and the bottom surface of the substrate as a first gap, and a second holding plate that has a second flat plate portion facing the bottom surface of the substrate, the second holding plate being configured to hold the substrate to form a gap between a top surface of the second flat plate portion and the bottom surface of the substrate as a second gap that is larger than the first gap; mounting any one the first holding plate and the second holding plate on a rotational shaft configured to rotate the substrate, and processing the substrate while supplying a fluid to the bottom surface of the substrate from a fluid supply unit configured to supply a fluid to the bottom surface of the substrate.

In the above-described substrate processing method, the first holding plate is mounted when a gas is supplied from the fluid supply unit, and the second holding plate is mounted when a liquid is supplied from the fluid supply unit.

According to the above-described exemplary embodiment, a single processing unit may be used for a plurality of kinds of processings without complicating the structure thereof.

Hereinafter, exemplary embodiments of the present disclosure will be described with reference to the accompanying drawings.

FIG. 1 is a view illustrating an outline of a configuration of a substrate processing system according to an exemplary embodiment of the present disclosure. In the following, in order to clarify positional relationships, the X-axis, Y-axis and Z-axis which are orthogonal to one another will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of wafers W horizontally.

The transfer section 12 is provided adjacent to the carrier placing section 11, and provided with a substrate transfer device 13 and a delivery unit 14. The substrate transfer device 13 is provided with a substrate holding mechanism configured to hold the wafer W. Further, the substrate transfer device 13 is movable horizontally and vertically and pivotable around a vertical axis, and transfers the wafers W between the carriers C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a substrate holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the substrate holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
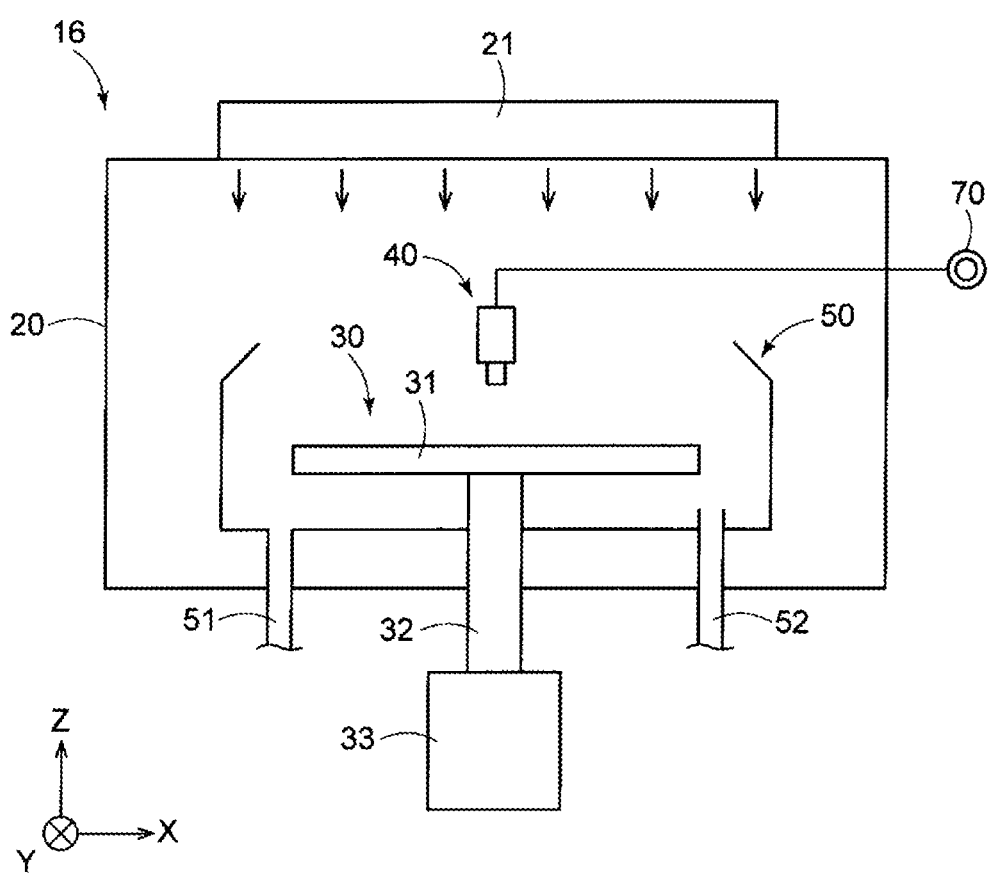
FIG. 2 is a vertical sectional view illustrating an outline of a configuration of a processing unit.

Next, descriptions will be made on an outline of a configuration of the processing unit 16 with reference to FIG. 2. FIG. 2 is a view illustrating an outline of a configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

Next, detailed descriptions will be made on a configuration of the substrate holding mechanism 30, particularly, the holding unit 31 and an upper part of the support unit 32, i.e., a rotational shaft (hereinafter referred to as a "rotational shaft 32"), with reference to FIGS. 3 to 6.

A vertically extending hollow is formed inside the rotational shaft 32. A processing liquid supply pipe 401 that extends vertically is provided inside the hollow. Herein, a combination of the rotational shaft 32 and the processing liquid supply pipe 401 will be referred to as a "shaft mechanism." A processing liquid supply passage 402 is formed inside the processing liquid supply pipe 401. The top end of the processing liquid supply passage 402 forms a processing liquid nozzle 403 that ejects a processing liquid toward the central portion of the rear (bottom) surface of the wafer W. A space having a ring-shaped cross section extends vertically between the inner wall surface of the rotational shaft 32 and the outer wall surface of the processing liquid supply pipe 401. This space becomes a gas supply passage 404 that supplies, for example, nitrogen gas toward the rear surface of the wafer W.

A processing liquid and a processing gas are supplied to the processing liquid supply passage 402 and the gas supply passage 404, respectively, through a processing liquid supply mechanism 71 and a processing gas supply mechanism 72, respectively, which are components of a processing liquid supply source 70 (see, e.g., FIG. 2), at a controlled flow rate. The processing liquid supply mechanism 71 of the present exemplary embodiment is configured to be capable of selectively supplying a dilute hydrofluoric acid (DHF) as a chemical liquid for washing the rear surface of the wafer W, and de-ionized water (DIW) as a rinse liquid to the processing liquid supply passage 402. The processing liquid supply mechanism 71 may be provided with, for example, an opening/closing valve and a flow rate control valve that are installed in a processing liquid line interconnecting a supply source of each of the liquids (DHF and DIW) and the processing liquid supply passage 402. The processing gas supply mechanism 72 of the present exemplary embodiment is configured to supply nitrogen gas to the gas supply passage 404. The processing gas supply mechanism 72 may be provided with, for example, an opening/closing valve and a flow rate control valve that are installed in a processing gas line interconnecting a supply source of the nitrogen gas and the processing gas supply passage 404.

The processing liquid supply pipe 401 is separated from the rotational shaft 32 so as not to be rotated even when the rotational shaft 32 is rotated, or supported by the rotational shaft 32 through a bearing so as to be relatively rotated with respect to the rotational shaft 32. A configuration in which the processing liquid supply pipe 401 is rotated integrally with the rotational shaft 32 may be adopted. In the present exemplary embodiment, the processing fluid supply unit 70 of FIG. 2 is configured with, for example, the processing liquid supply pipe 401, the processing liquid supply passage 402, the processing liquid nozzle 403, and the gas supply passage 404 as described above, an enlarged diameter portion 405 to be described later. However, the present disclosure is not limited to this structure. For example, the processing liquid supply passage 402 and the processing liquid nozzle 403 may be configured as one common fluid supply passage, and only one ejection port may be formed at the position of the processing liquid nozzle 403 such that the supply from the processing fluid supply source 70 and the supply from the processing liquid supply mechanism 71 are switched.

The holding unit 31 of the substrate holding mechanism 30 is configured with a first holding plate 31A or a second holding plate 31B that is detachable from the top portion of the rotational shaft 32. Depending on the processing to be performed by the processing unit 16, the holding plate (the first holding plate 31A or the second holding plate 31B) suitable for the processing is mounted on the top portion of the rotational shaft 32. The first holding plate 31A may be used when a liquid processing is performed on the front surface of the wafer W by supplying a processing liquid to the front surface of the wafer W while supplying a gas (without supplying the processing liquid) to the rear surface of the wafer W. Meanwhile, the second holding plate 31B may be used when a liquid processing is performed on both the front and rear surfaces of the wafer W by supplying a processing liquid to the front and rear surfaces of the wafer W.

Figure 3:
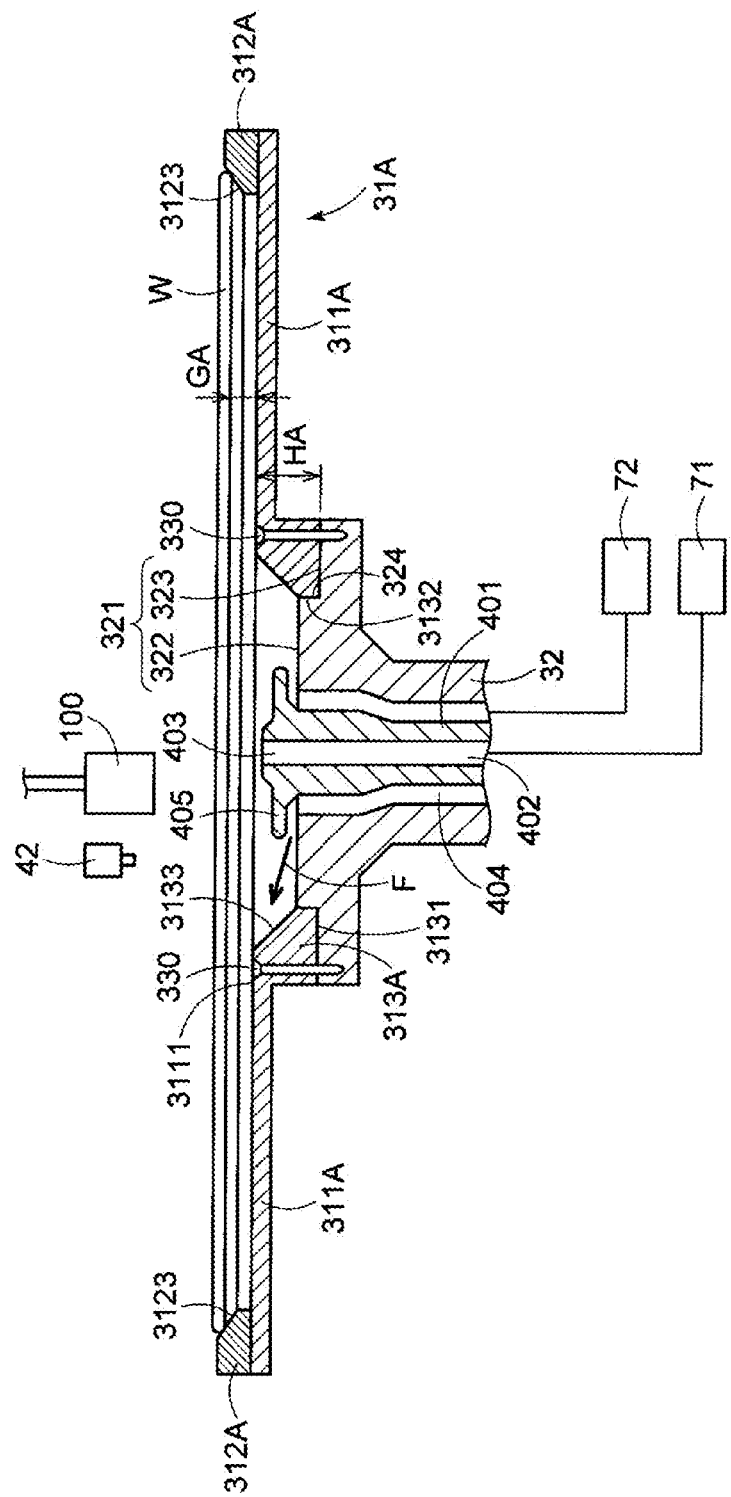
FIG. 3 is a vertical sectional view illustrating a state in which a first holding plate is mounted on a rotational shaft.
Figure 4:
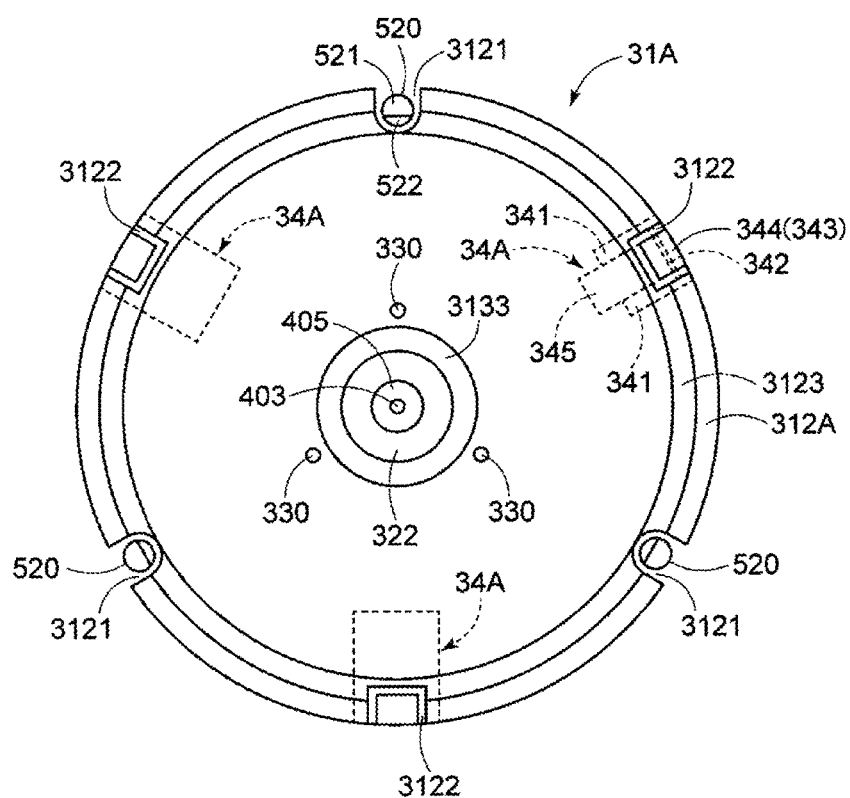
FIG. 4 is a plan view illustrating a state in which the first holding plate is mounted on the rotational shaft.

FIGS. 3 and 4 are a vertical sectional view and a plan view, respectively, which illustrate a state in which the first holding plate 3A is mounted on the top portion of the rotational shaft. The first holding plate 31A has a flat plate portion 311A facing the rear surface of the wafer W. The top surface of the flat plate portion 311A is flat. A wafer support unit 312A configured to be in contact with a bevel portion of the wafer W to support the wafer W is provided at the outer peripheral edge of the flat plate portion 311A. An attachment portion 313A configured to attach the first holding plate 31A to the rotational shaft 32 is provided at the inner peripheral edge of the flat plate portion 311A.

The top surface 321 of the rotational shaft 32 includes a ring-shaped (annular) central area 322 and a ring-shaped peripheral area 323 placed outside the central area 321. Each of the central area 322 and the peripheral area 323 of the top surface 321 is positioned in a horizontal plane. The central area 322 is higher than the peripheral area 323, and a ring-shaped vertical wall 324 is formed between the central area 322 and the peripheral area 323.

The first holding plate 31A and the rotational shaft 32 are connected to each other by a screw 330 in a state in which the bottom surface 3131 of the attachment portion 313A of the first holding plate 31A is loaded on the peripheral area 323, and the inner peripheral surface 3132 of the attachment portion 313A faces (substantially in contact with) the vertical wall 324. The first holding plate 31A and the rotational shaft 32 are relatively horizontally positioned by the inner peripheral surface 3132 and the vertical wall 324, which substantially face and are in contact with each other. The attachment portion 313A is formed with a hole having a female screw, into which a male screw portion of the screw 330 is screwed. Herein, the portion of the rotational shaft 32 to which the attachment portion 313A is connected is referred to as the "connection portion."

The enlarged diameter portion 405 is formed at the top end of the processing liquid supply pipe 401 and completely covers the top end opening of the ring-shaped gas supply passage 404 from the upper side of the top end opening. Accordingly, even when a part of a processing liquid ejected from the processing liquid nozzle 403 drops downward, the processing liquid cannot infiltrate into the gas supply passage 404. Further, since the enlarged diameter portion 405 is provided, the gas flowing through the gas supply passage 404 is injected from a gap between the central area 322 of the top surface 321 of the rotational shaft 32 and the bottom surface of the enlarged diameter portion 405 radially outwardly in a horizontal direction or obliquely upward (represented by arrow F in FIG. 3).

The attachment portion 313A of the first holding plate 31A is formed with an inclined surface 3133 in a conical surface shape that extends obliquely upward and radially outward from the upper end of the inner peripheral surface 3132. A gas flow F is guided by the inclined surface 3133 to be led to the gap between the top surface 3111 of the flat plate portion 311A and the rear surface of the wafer W.

As illustrated in FIG. 4, the wafer support unit 312A is formed with a cut-off portion 3121 at a position where a lift pin 520 to be described later is provided, and a cut-off portion 3122 at a position where a clamping claw 344 to be described later is provided. Other than the positions where the cut-off portions 3121 and 3122 are provided, the wafer support unit 312A continuously extends in a circumferential direction along the outer peripheral edge of the first holding plate 31A.

The wafer support unit 312A has an inclined surface 3123 that is inclined to be higher toward the radially outer side. When the wafer support unit 312A supports the wafer W, the inclined surface 3123 and the bevel portion of the peripheral edge of the wafer W are in line contact with each other along the circumferential direction. That is, the gap between the inclined surface 3123 and the bevel portion is in a substantially sealed state. When a gas is supplied to a space between the rear surface of the wafer W and the wafer support unit 312A (a space below the wafer), the gas is capable of flowing out from the space below the wafer only through the narrow gaps nearby the cut-off portions 3121 and 3122. Accordingly, when the gas is supplied to the space below the wafer, the internal pressure of the space below the wafer increases so that a fluid containing a contaminant can be suppressed from infiltrating into the space below the wafer from the gap between the outer peripheral edge of the wafer W and the outer peripheral edge of the first holding plate 31A.

Next, descriptions will be made on a wafer lifting mechanism 52A that participates in transferring the wafer W to the first holding plate 31A and a wafer clamping mechanism 34A that participates in fixing the wafer W to the first holding plate 31A, with reference to FIGS. 4 and 7 to 10. For simplification of the drawings, FIGS. 3 and 5 do not illustrate the wafer lifting mechanism 52A and the wafer clamping mechanism 34A.

As schematically illustrated in FIG. 4, the lift pin 520 of the wafer lifting mechanism 52A is provided at a position of the first holding plate 31A which corresponds to the cut-off portion 3121, and the wafer clamping mechanism 34A is provided at a position of the first holding plate 31A which corresponds to the cut-off portion 3122. In the present exemplary embodiment, three lift pins 520 and three wafer clamping mechanisms 34A are provided.

The wafer clamping mechanism 34A has a generally L-shaped operation piece 343 that is attached to a rotational shaft 342 supported by a shaft support unit 341 protruded downwardly from the peripheral edge of the bottom surface of the first holding plate 31A. The clamping claw 344 is provided at a tip end of one arm of the operation piece 343 so as to clamp the wafer W, and a pressed portion 345 is provided at a tip end of the opposite arm. FIG. 4 represents all the components of the wafer clamping mechanism 34A only at the upper right part thereof and the components of each of the other wafer clamping mechanisms 34A in a simplified box.

The operation piece 343 is biased by a spring (not illustrated) provided around the rotational shaft 342 such that the top end portion of the clamping claw 344 moves inwardly in the radial direction of the first holding plate 31A. By this biasing force, the three clamping claws 344 may clamp the wafer W in the horizontal direction and restrain the wafer W not to move in the diametrical and upward directions. See, for example, FIG. 10 illustrating a state in which the clamping claws 344 are engaged with the end edge of the wafer W.

Below the operation piece 343, an annular push-up plate 350 capable of being lifted by a lifting mechanism (not illustrated) is provided. When the push-up plate 350 is lifted to press the pressed portion 345, the operation piece 343 is pivoted around the rotational shaft 343 against the elastic force of the spring (not illustrated), and the clamping claw 34 moves outwardly in the radial direction of the first holding plate 31A to be placed at a release position, so that the holding of the wafer W is released (see, e.g., FIG. 9).

Figure 8:
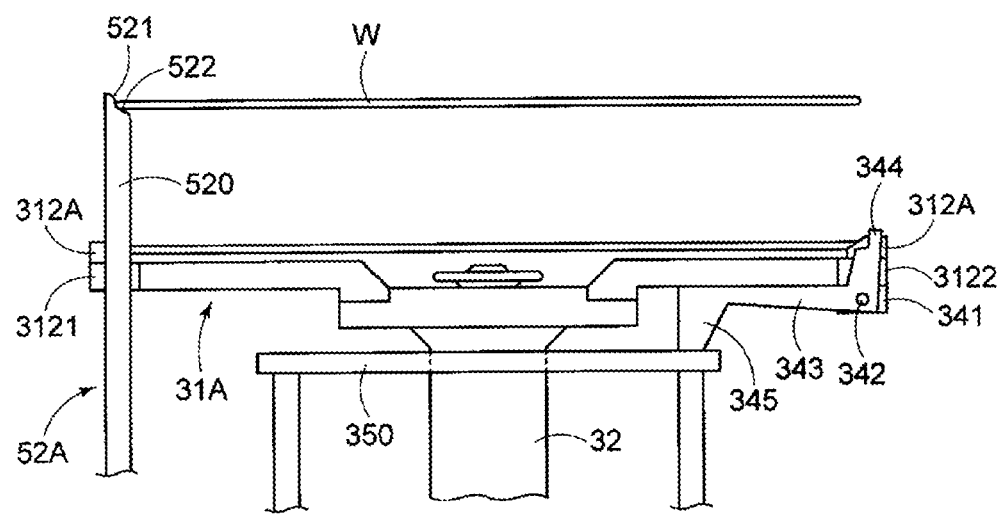
FIG. 8 is a schematic side view for describing an operation of the wafer lifting mechanism and the wafer clamping mechanism.
Figure 9:
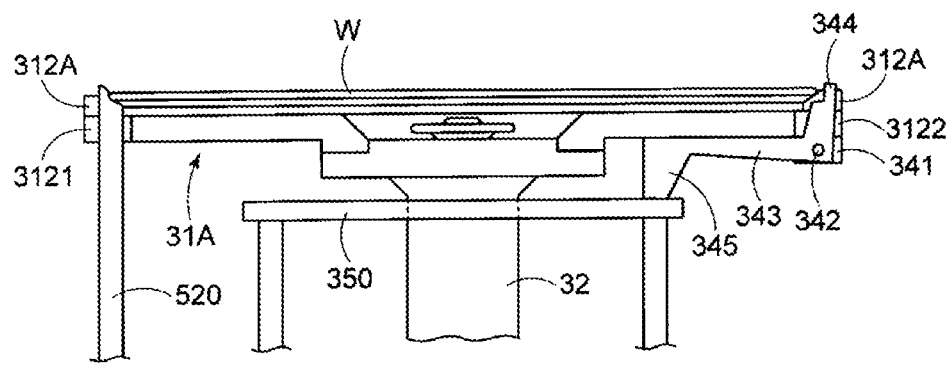
FIG. 9 is a schematic side view for describing an operation of the wafer lifting mechanism and the wafer clamping mechanism.
Figure 10:
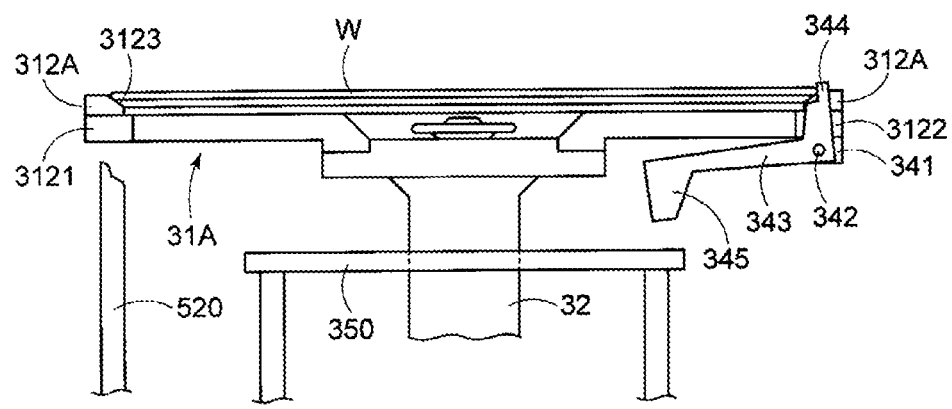
FIG. 10 is a schematic side view for describing an operation of the wafer lifting mechanism and the wafer clamping mechanism.

As illustrated in FIGS. 7 to 10, the lift pin 520 is lifted passing through the inside of the cut-off portion 3121. FIGS. 8 to 10 represent one operation piece 343 and one lift pin 520 so that the drawings can be easily viewed.

On the top end portion of the lift pin 520, a guide surface 521 and a support surface 522 are formed such that to the guide surface 521 and the support surface 522 are inclined to be gradually lowered from the radially outer side toward the radially inner side of the first holding plate 31A. The guide surface 521 has a large inclination angle and guides the wafer W to a proper horizontal position.

A lower portion of each of the lift pins 520 is fixed to an annular common connection plate (not illustrated) that is capable of being lifted by a lift driving unit (e.g., an air cylinder) (not illustrated). Thus, by the lift driving unit, all the lift pins 520 may be simultaneously lifted by an equal distance. Further, in order not to disturb the lifting operation of the lift pins 520, a rotation angle position of the first holding plate 31A is controlled such that the cut-off portions 3121 are located right above the lift pins 520, respectively, when the rotation of the first holding plate 31A is stopped.

The transfer arm (not illustrated in FIGS. 8 to 10) of the substrate transfer device 17 (see, e.g., FIG. 1) enters the processing unit 16 in a state of holding an unprocessed wafer W, and stops at a position above the first holding plate 31A. Next, the lift pins 520 are lifted and receive the wafer W from the transfer arm. Thereafter, the transfer arm moves back from the processing unit 16. At this time, the clamping claws 344 are located at the release position. FIG. 8 represents this state.

Thereafter, the lift pins 520 move downward, and during this process, the wafer W is placed on the wafer support unit 312A (see, e.g., FIG. 9). Next, the clamping claws 344 move to the clamping position and restrain the wafer W so as not to move (see, e.g., FIG. 10). In this state, while the first holding plate 31A, which is holding the wafer W, is rotated, a processing fluid is supplied to the wafer W, and a predetermined processing is performed on the wafer W.

When the processing on the wafer W is terminated, the clamping claws 344 move to the release position, and the lift pins 520 lift the wafer W placed on the wafer support unit 312A and transfer the wafer W to the transfer arm that has entered the processing unit 16. The transfer arm that has received the wafer W moves back to the outside of the processing unit 16.

Figure 5:
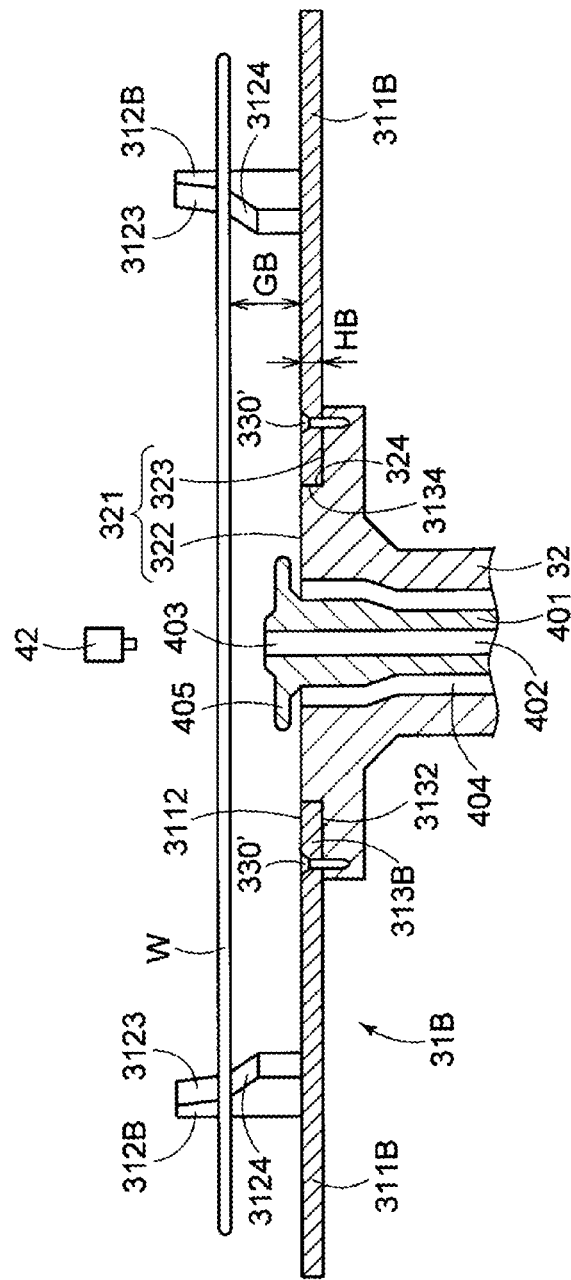
FIG. 5 is a vertical sectional view of a state in which a second holding plate is mounted on the rotational shaft.
Figure 6:
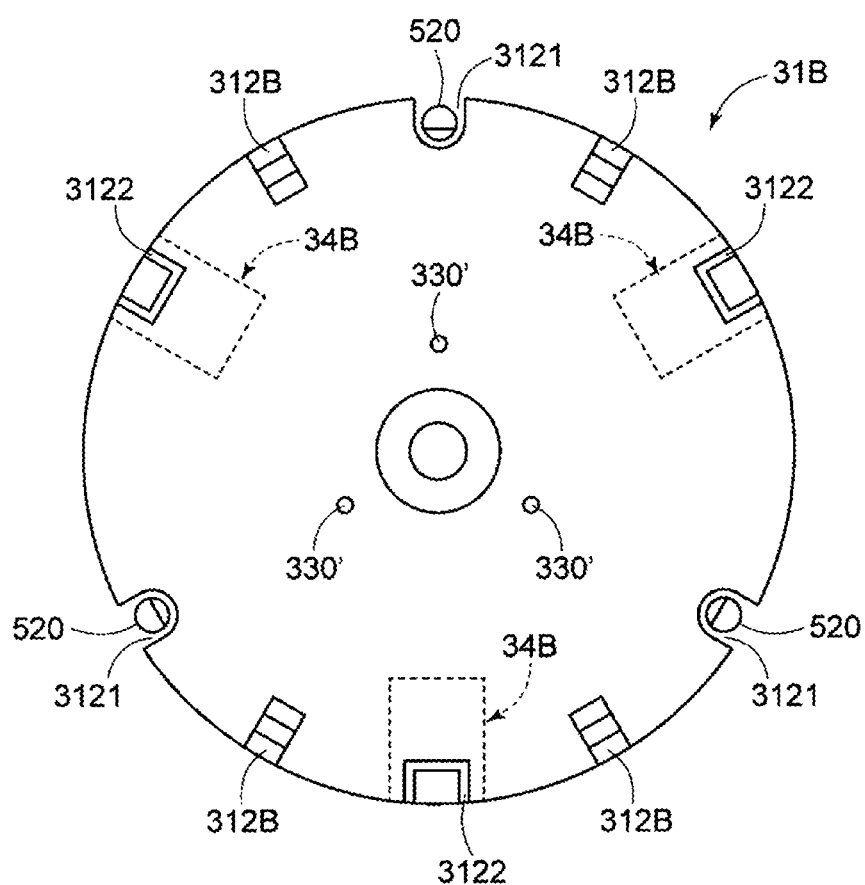
FIG. 6 is a plan view illustrating a state in which the second holding plate is mounted on the rotational shaft.
Figure 7:
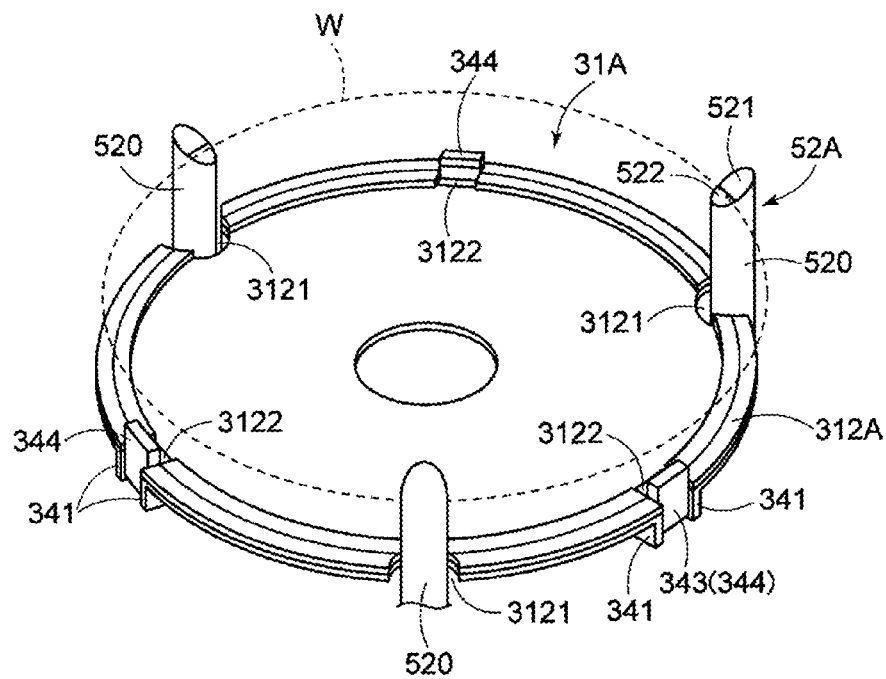
FIG. 7 is a perspective view illustrating a wafer lifting mechanism and a wafer clamping mechanism.

FIGS. 5 and 6 are a vertical sectional view and a plan view illustrating a state in which the second holding plate 31B is mounted on the top portion of the rotational shaft. The second holding plate 31A has a flat plate portion 311B that faces the rear surface of the wafer W. The top surface of the flat plate portion 311B is flat. At an outer peripheral edge of the flat plate portion 311B, a plurality of wafer support units 312B are provided to support the wafer W by being in contact with a bevel part of the wafer W. At an inner peripheral edge of the flat plate portion 311B, an attachment portion 313B is provided to attach the second holding plate 31B to the rotational shaft 32 (the support unit).

Each of the wafer support units 312B is formed with a guide surface 3123 and a support surface 3124 that are inclined to be gradually lowered from the radially outer side toward the radially inner side of the first holding plate 31A. The guide surface 3123 has a large inclination angle and guides the wafer W to a proper position with respect to the horizontal direction. The support surface 3124 supports the bevel part of the wafer W.

Like the first holding plate 31A, the second holding plate 31B is coupled to the rotational shaft 32 by screws 330' in a state in which the inner peripheral surface of the attachment portion 313B faces (substantially in contact with) the vertical wall 324.

The second holding plate 31B is mainly different from the first holding plate 31B in the following features.

(Difference 1) The gap GB between the bottom surface of the wafer W held by the second holding plate 31B and the top surface 3112 of the flat plate portion 311B is larger than the gap GA between the bottom surface of the wafer W held by the first holding plate 31A and the top surface 3111 of the flat plate portion 311A. This difference in gap is derived from the difference between the height HA of the attachment portion 313A and the height HB of the attachment portion 313B. Here, the heights HA and HB mean the distances from the bottom surfaces 3131 and 3132 of the attachment portions 313A and 313B to the top surfaces 3111 and 3112 of the attachment portions 313A and 313B, respectively.

(Difference 2) The circumferential length of the wafer support unit 312B is much shorter than the circumferential length of the wafer support unit 312A.

In addition, the wafer clamping mechanism 34B provided on the second holding plate 31B is not exactly the same as the wafer clamping mechanism 34A provided on the first holding plate 31A. However, the mechanisms are slightly different from each other in terms of the positions and the dimensions of the shaft support units 341 and the operation pieces 343, and identical to each other in terms of the basic structure and the operation principle. In addition, the transfer between the second holding plate 31B and the lift pins 520 is identically performed to the transfer between the first holding plate 31A and the lift pins 520.

In view of Differences 1 and 2 described above, when a processing liquid is ejected from the processing liquid nozzle 403 to the central portion of the bottom surface of the wafer W held and rotated on the second holding plate 31B, the processing liquid may flow radially outwardly along the bottom surface of the wafer W to be scattered outwardly from the outer periphery of the wafer W, due to the large gap GB. When the processing liquid is ejected from the processing liquid nozzle 403 to the central portion of the bottom surface of the wafer W held and rotated on the first holding plate 31A, it is difficult to make the processing liquid flow radially outwardly along the bottom surface of the wafer W due to the small gap GA. Meanwhile, when the second holding plate 31B is used, it is difficult to suppress inlet of a gas into the space below the wafer from the outside by increasing the internal pressure of the space below the wafer W between the top surface of the wafer holding plate and the bottom surface of the wafer W as in the case where the first holding plate 31A is used.

Due to the functional differences, the usages of the first holding plate 31A and the second holding plate 31B are different from each other. An example of an appropriate usage of the first holding plate 31A is a scrub washing processing on the front surface of the wafer W. An example of an appropriate usage of the second holding plate 31B is a processing of simultaneously washing the front and rear surfaces of the wafer W with a chemical liquid.

Brief descriptions will be made on the scrub washing processing on the front surface of the wafer W (the device forming surface) using the first holding plate 31A. In a state in which the wafer W held by the first holding plate 31A is rotated around the perpendicular axis, a washing liquid such as, for example, pure water, is supplied to the wafer W, and a brush 100 rotated around its perpendicular axis (see, e.g., FIG. 3) comes in contact with the front surface of the wafer W and moves along the front surface of the wafer W to perform the scrub washing process. At this time, the pure water may be supplied from the brush 100 or the nozzle 42. After the scrub washing process is terminated, the pure water is supplied as a rinse liquid from the nozzle 42 to the front surface of the wafer W while continuously rotating the wafer W to perform a rinsing process. After the rinsing process is terminated, the supply of the rinse liquid from the nozzle is stopped, and a drying process is performed to shake off and remove the rinse liquid remaining on the wafer W while continuously rotating the wafer W (preferably, with an increased rotation speed).

During the above-described scrub washing process, the rinsing process, and the drying process, nitrogen gas is continuously supplied to the space below the wafer through the gas supply passage 404. Accordingly, the internal pressure of the space below the wafer increases, thereby suppressing the contamination of the rear surface of the wafer (non-device forming surface) which may be caused when the processing liquid (DIW) supplied to the front surface of the wafer W or the surrounding atmosphere around the wafer that may contain a contaminant is introduced into the space below the wafer. Further, there is also an advantage in that since the wafer support unit 312A of the first holding plate 31A supports the almost overall peripheral edge of the wafer W (excluding the cut-off portions 3121 and 3122), local bending of the wafer W, which is pressed by the brush 100, hardly occurs.

Brief descriptions will be made on the processing of washing the front and rear surfaces of the wafer W with a chemical liquid by using the second holding plate 31B. In a state in which the wafer W held by the first holding plate 31A is rotated around the perpendicular axis, a chemical liquid (e.g., DHF) is supplied from the nozzle 42 to the central portion of the front surface of the wafer W and from the nozzle 403 to the central portion of the rear surface of the wafer W to perform the chemical liquid washing process. The chemical liquid supplied from the nozzles 42 and 403 diffuses and flows toward the peripheral edge of the wafer W due to the centrifugal force, thereby forming a liquid film that covers the entire front and rear surfaces of the wafer W.

As a result, for example, an oxide on the front and rear surfaces of the wafer W is removed. Thereafter, in the state in which the wafer W is rotated, the rinse liquid (DIW) is supplied from each of the nozzles 42 and 403 such that the rinsing process is performed. Thereafter, the supply of the rinse liquid from the nozzles 42 and 403 is stopped, and a drying process is performed while continuously rotating the wafer (preferably with an increased rotation speed) to shake off and remove the rinse liquid remaining on the wafer W. During the drying process, nitrogen gas may be supplied to the space below the wafer through the gas supply passage 404, and as a result, the concentration of oxygen in the space below the wafer decreases, so that water marks are not easily formed. During the chemical liquid washing process and the rinsing process as well, a small amount of the nitrogen gas may be ejected through the gas supply passage 404, thereby suppressing the processing liquid from infiltrating into the gas supply passage 404.

In either the case where the chemical liquid is supplied to the front surface of the wafer W or the case where the rinse liquid is supplied to the front surface of the wafer W, the DIW may be continuously supplied to the rear surface of the wafer W. In this case, the DIW supplied to the rear surface of the wafer W performs a function to suppress the chemical liquid supplied to the front surface of the wafer W from flowing to the rear surface of the wafer W.

In the case of using the second holding plate 31B, the processing liquid supplied to the rear surface of the wafer W flows along the rear (bottom) surface of the wafer toward the peripheral edge of the wafer, so that the liquid processing on the rear surface of the wafer W may be effectively performed. For the second holding plate 31B, the top surface 3112 of the attachment portion 313B and the central area 322 of the top surface 321 of the rotational shaft 32 are placed on the same plane, that is, at the same height position. Accordingly, the processing liquid supplied to the rear surface of the wafer W and then dropped from the rear surface of the wafer W to the top surface 3112 of the attachment portion 313B smoothly flows outward. Thus, the dropped processing liquid is suppressed from infiltrating into the gas supply passage 404. Further, the top surface 3112 may be lower than the central portion 322 of the top surface 321 of the rotational shaft 32.

According to the exemplary embodiment described above, in preforming different processings by using a single common processing unit 16, the holding plates 31A and 31B are selectively used to form the different gaps GA and GB between the holding plates and the wafer W, so that the fluid flow on the rear surface side of the wafer W may be optimized depending on kinds of the processings. Hence, when performing two or more kinds of processings by using the single common processing unit 16, a satisfactory processing result may be obtained in both processings. Further, since the single processing unit 16 can be commonly used for different processings, apparatus costs of the substrate processing system 1 and foot print of the substrate processing system 1 in a semiconductor manufacturing plant may be reduced. In addition, in the exemplary embodiment described above, since a driving mechanism configured to modify the gaps GA and GB is not mounted in the substrate holding mechanism 30, there is no case where such a driving mechanism adversely affects the substrate holding mechanism 30.

In addition, the holding plates 31A and 31B may be further optimized with respect to a processing to be performed by modifying configurations or dimensions of the components other than the holding plates 31A and 31B in addition to the gaps GA and GB (e.g., by forming the inclined surface 3133 on the holding plate 31A and/or by changing the circumferential lengths of the wafer support units 312A and 312B with the holding plates 31A and 31B).

Figure 11:
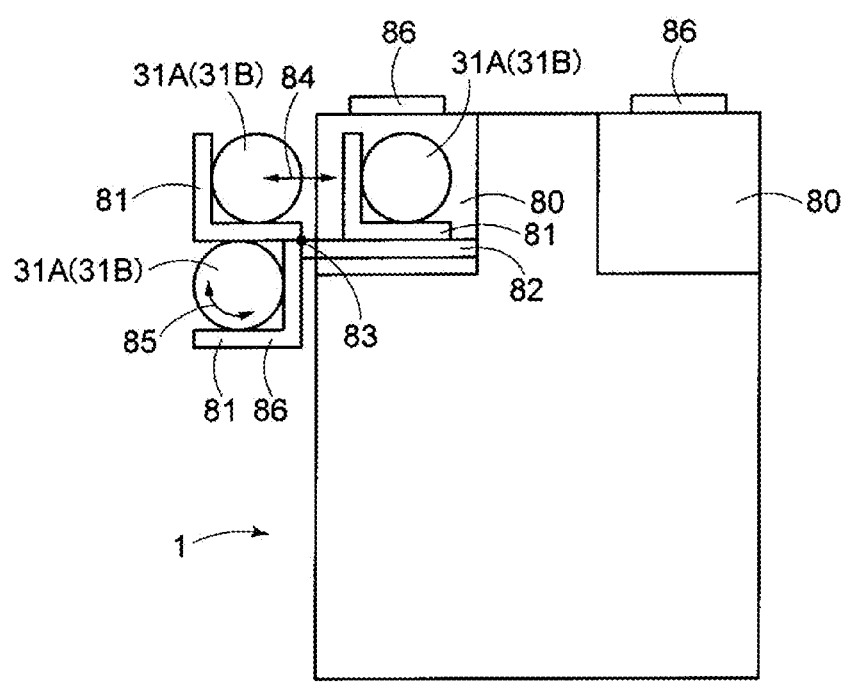
FIG. 11 is a schematic side view illustrating an example of an accommodation section of a holding plate.

Meanwhile, in the exemplary embodiment described above, the unused holding plate 31A or 31B may be accommodated in a plate accommodation box (accommodation section) 80. The plate accommodation box 80 may be provided on, for example, the side surface of the housing that is the farthest from the carrier arrangement section 11 of the substrate processing system 1 in FIG. 1. FIG. 11 illustrates the side surface of the housing on which the plate accommodation box 80 is provided. As illustrated in the left portion of FIG. 11, the plate accommodation box 80 has an L-shaped plate holding member 81, on which the holding plate 31A or 31B is placed. The plate holding member 81 is movable along a guide rail 82 extending horizontally (see arrow 84 in FIG. 11). Once the holding plate is taken out from the plate accommodation box 80, the plate holding member 81 may pivot the holding plate by 90° (see arrow 85 in FIG. 11). When the plate holding member 81 is placed at the position represented by reference numeral 86 in FIG. 11, an operator may attach/detach the holding plate 31A or 31B with respect to the plate holding member 81. A clean air supply unit is provided on the ceiling of the plate accommodation box 80 so as to supply clean air into the plate accommodation box 80, so that the inside of the plate accommodation box 80 is always kept clean.

In the exemplary embodiment described above, the connection between the holding plates 31A and 31B and the rotational shaft 32 is performed by the screws 330 and 330', but the present disclosure is not limited thereto. The connection between the holding plates 31A and 31B and the rotational shaft 32 may be performed by a magnetic force. In this case, a permanent magnet may be embedded in each of the attachment portions 313A and 313B and the portion of the rotational shaft 32 facing thereto. The holding plates 31A and 31B and the rotational shaft 32 may be connected by a latch connection.

Figure 12:
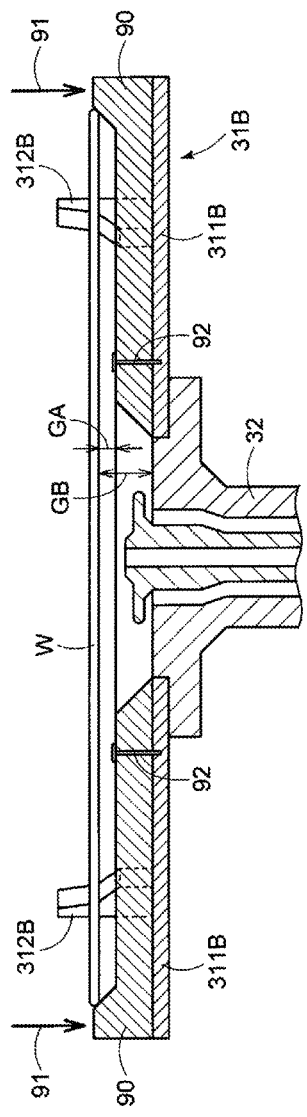
FIG. 12 is a vertical sectional view illustrating an exemplary configuration in which a shape dimension of a space below a wafer is capable of being modified.

In the exemplary embodiment described above, a desired space below the wafer may be formed by mounting any one the first holding plate 31A and the second holding plate 31B on the rotational shaft 32, but the present disclosure is not limited thereto. For example, as illustrated in FIG. 12, a secondary plate having a top surface having a shape corresponding to the shape of the top surface of the first holding plate 31A may be mounted on the substrate holding mechanism having a configuration corresponding to the configuration illustrated in FIG. 5 in which the second holding plate 31B is mounted on the rotational shaft 32. In this way, a configuration substantially equivalent to the configuration illustrated in FIG. 3 in which the first holding plate 31A is mounted on the rotational shaft 32 may be obtained. In this case, as represented by arrow 91, the secondary plate 90 is placed on the second holding plate 31B from the upper side, and fixed to the second holding plate 31B by screws 92 schematically illustrated in FIG. 12. In this case, it is required to form cut-off portions in the peripheral edge of the secondary plate 90 in order to suppress interference of the secondary plate 90 with the wafer support unit 312B of the second holding plate 31B when the secondary plate 90 is fixed, in addition to cut-off portions identical to the cut-off portions that are formed in the second holding plate 31B in order to suppress interference of the second holding plate 31B with the lift pins 520 of the wafer lifting mechanism 52A and the clamping claws 344 of the wafer clamping mechanism 34A.

In the exemplary embodiment described above, two kinds of holding plates are selectively connected to the rotational shaft 32, but three or more kinds of holding plates may be selectively connected thereto.

The substrate to be processed by the processing unit 16 is not limited to the semiconductor wafer W and may be other types of substrates such as, for example, a glass substrate and a ceramic substrate.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
   a fluid supply unit configured to supply a fluid to a bottom surface of a substrate;
   a first holding plate that includes a first flat plate portion that directly faces the bottom surface of the substrate;
   a second holding plate that includes a second flat plate portion that directly faces the bottom surface of the substrate;
   a rotational shaft configured to rotate the substrate; and
   a connection portion provided on the rotational shaft to connect therewith both the first holding plate and the second holding plate;
   wherein the first holding plate is configured to hold the substrate to form a vertical gap between a top surface of the first flat plate portion and the bottom surface of the substrate as a first gap when the connection portion connects the first holding plate, and the second holding plate is configured to hold the substrate to form a vertical gap between a top surface of the second flat plate portion and the bottom surface of the substrate as a second gap when the connection portion connects the second holding plate.

2. The substrate processing apparatus of claim 1, wherein the fluid supply unit supplies a gas to the first gap and supplies a liquid to the second gap.

3. The substrate processing apparatus of claim 1, wherein a top surface of the rotational shaft has a central area and a peripheral area that is formed around the central area and has a height lower than that of the central area,
   the connection portion is provided in the peripheral area,
   the first holding plate has a first attachment portion to be attached to the connection portion,
   the second holding plate has a second attachment portion to be attached to the connection portion, and
   a difference between the first gap and the second gap corresponds to a difference between a height of the first attachment portion and a height of the second attachment portion.

4. The substrate processing apparatus of claim 1, wherein the top surface of the rotational shaft has a central area and a peripheral area that is formed around the central area to have a height lower than that of the central area,
   the connection portion is provided in the peripheral area,
   the second holding plate has a second attachment portion that is attached to the connection portion, and
   a height of a top surface of the second holding plate becomes a same height of the central area when the second attachment portion is attached to the connection portion.

5. The substrate processing apparatus of claim 1, wherein the top surface of the rotational shaft has a central area and a peripheral area that is formed around the central area and has a height lower than that of the central area,
- the connection portion is provided in the peripheral area,
- the first holding plate has a first attachment portion to be attached to the connection portion, and
- the first holding plate has an inclined surface that is formed to guide a gas supplied from the fluid supply unit toward a first side of the first flat plate portion from the central area when the first attachment portion is attached to the connection portion.

6. The substrate processing apparatus of claim 5, further comprising:
- a processing liquid supply pipe configured to supply a liquid from the fluid supply unit;
- a gas supply passage configured to supply a gas from the fluid supply unit; and
- a circular diameter portion that covers the gas supply passage at a first side thereof around a first end of the processing liquid supply pipe,
- wherein the inclined surface guides the gas passing between the circular diameter portion and the central area toward the first side of the first flat plate portion.

7. The substrate processing apparatus of claim 1, wherein at least one first holding plate and at least one second holding plate are provided.

8. The substrate processing apparatus of claim 1, further comprising:
- an accommodation section including an L-shaped holding member, wherein the L-shaped holding member is configured to hold at least one of the first holding plate and the second holding plate.

9. A substrate processing method comprising:
- providing a first holding plate that has a first flat plate portion facing the bottom surface of the substrate, the first holding plate being configured to hold the substrate to form a vertical gap between a top surface of the first flat plate portion and the bottom surface of the substrate as a first gap, and a second holding plate that has a second flat plate portion facing the bottom surface of the substrate, the second holding plate being configured to hold the substrate to form a vertical gap between a top surface of the second flat plate portion and the bottom surface of the substrate as a second gap that is larger than the first gap;
- mounting any one of the first holding plate and the second holding plate on a rotational shaft configured to rotate the substrate; and
- processing the substrate while supplying a fluid to the bottom surface of the substrate from a fluid supply unit configured to supply a fluid to the bottom surface of the substrate.

10. The substrate processing method of claim 9, wherein the first holding plate is mounted when a gas is supplied from the fluid supply unit, and the second holding plate is mounted when a liquid is supplied from the fluid supply unit.

\* \* \* \* \*